(12) United States Patent
Krabbenborg et al.

(10) Patent No.: US 9,041,468 B2
(45) Date of Patent: May 26, 2015

(54) SWITCHED-MODE POWER SUPPLY AND METHOD OF OPERATION

(71) Applicant: NXP B.V., Eindhoven (NL)

(72) Inventors: Benno Krabbenborg, Arnhem (NL); Marco Berkhout, Tiel (NL); Johan Somberg, Wijchen (NL); Peter Van De Haar, Veldhoven (NL)

(73) Assignee: NXP B.V., Eindhoven (NL)

( * ) Notice: Subject to any disclaimer, the term of this patent is extended or adjusted under 35 U.S.C. 154(b) by 248 days.

(21) Appl. No.: 13/847,713

(22) Filed: Mar. 20, 2013

(65) Prior Publication Data

US 2013/0257533 A1 Oct. 3, 2013

(30) Foreign Application Priority Data

Apr. 3, 2012 (EP) .................................... 12163013

(51) Int. Cl.
| | |
|---|---|
| *H03F 3/04* | (2006.01) |
| *H03G 3/00* | (2006.01) |
| *G05F 5/00* | (2006.01) |
| *H03F 3/217* | (2006.01) |
| *H02M 3/158* | (2006.01) |
| *H02M 1/00* | (2006.01) |
| *H02M 3/156* | (2006.01) |

(52) U.S. Cl.
CPC ............... *G05F 5/00* (2013.01); *H03F 3/2171* (2013.01); *H02M 3/158* (2013.01); *H02M 2001/0019* (2013.01); *H02M 2003/1566* (2013.01)

(58) Field of Classification Search
USPC .............................. 330/297, 127, 302, 207 A IPC ...................................... H03F 3/04; H03G 3/00
See application file for complete search history.

(56) References Cited

U.S. PATENT DOCUMENTS

| | | | | |
|---|---|---|---|---|
| 5,258,903 | A | 11/1993 | Rodriguez-Cavazos | |
| 6,104,248 | A * | 8/2000 | Carver | 330/297 |
| 6,614,309 | B1 * | 9/2003 | Pehlke | 330/296 |
| 7,421,604 | B1 | 9/2008 | Mimberg | |
| 7,812,585 | B2 | 10/2010 | Zhou et al. | |
| 7,830,220 | B2 * | 11/2010 | Ceylan et al. | 332/145 |
| 8,274,266 | B2 * | 9/2012 | Engelhardt et al. | 323/259 |
| 8,278,899 | B2 | 10/2012 | Schafmeister et al. | |
| 8,508,195 | B2 * | 8/2013 | Uno | 323/222 |
| 2005/0052168 | A1 * | 3/2005 | Tazawa et al. | 323/282 |
| 2006/0028271 | A1 * | 2/2006 | Wilson | 330/199 |
| 2006/0043942 | A1 | 3/2006 | Cohen | |
| 2006/0043947 | A1 * | 3/2006 | Clavette et al. | 323/282 |
| 2013/0229229 | A1 * | 9/2013 | Park et al. | 330/127 |

FOREIGN PATENT DOCUMENTS

| | | | |
|---|---|---|---|
| DE | 42 40 984 A1 | 7/1993 | |
| EP | 1 473 607 A1 | 11/2004 | |
| EP | 1 770 848 A2 | 4/2007 | |

OTHER PUBLICATIONS

Extended European Search Report for EP Patent Appln. No. 12163013.1 (Dec. 4, 2012).

* cited by examiner

*Primary Examiner* — Patricia T Nguyen

(57) ABSTRACT

A method of operating a switched-mode power supply (SMPS) for supplying power to a load circuit, which draws a supply current that varies with an input signal to the load circuit is disclosed. The method comprises monitoring the input signal and controlling the amount of accumulated energy transferred for consumption by the load circuit, in use, in accordance with the input signal.

16 Claims, 9 Drawing Sheets

SWITCHED-MODE POWER SUPPLY AND METHOD OF OPERATION

CROSS-REFERENCE TO RELATED APPLICATIONS

This application claims the priority under 35 U.S.C. §119 of European patent application no. 12163013.1, filed on Apr. 3, 2012, the contents of which are incorporated by reference herein.

BACKGROUND OF THE INVENTION

The invention relates to a method of operating a switched-mode power supply (SMPS) and to a SMPS for operation in accordance with the method.

SUMMARY OF THE INVENTION

Modern battery operated portable electronic equipment, such as smart phones, require highly efficient circuitry to prolong battery life and avoid generation of excess heat. For these reasons, switched-mode power supplies are typically used in such equipment. Buck converters are used to supply power to circuits that require a voltage lower than the battery voltage, whereas boost converters are used for circuits that require a voltage higher than the battery voltage.

One type of circuit that is commonly used in, for example, smart phones is an audio amplifier. To achieve the requirement of high efficiency, class-D amplifiers are used. Often to achieve the peak output power requirement, a voltage that is higher than the battery voltage must be used to drive the speaker. Thus, the amplifier needs to be supplied with power by a boost converter to increase the available voltage headroom.

It is desirable to supply the amplifier with the maximum possible supply voltage so that maximum peak output power can be obtained from the amplifier. However, any variations in the supply voltage (e.g. ripple, overshoot or dips) will either intrinsically reduce the available voltage or reduce the nominal voltage with which the amplifier is supplied so that the overshoot and ripple can be accommodated without causing damage to the amplifier or triggering overvoltage protection circuitry. Similar principles apply to other types of circuit supplied by either boost or buck converters.

With respect to the example of a class-D amplifier supplied by a boost converter, the frequency of the current supplied to the amplifier is twice the audio frequency of the input signal to the amplifier and may contain much higher signal harmonics if clipping occurs. To minimise variations in output voltage from the converter as a result of this fluctuating supply current, the converter must have low output impedance over a very wide frequency range and a high current slew rate so that it can follow the fast transients produced during clipping. It is difficult to achieve these goals with feedback controlled switched-mode power supplies so that the amplifier (or other circuitry) can be operated at the maximum possible supply voltage. The reasons for this will become apparent from the following detailed explanation.

A schematic for explaining the principle of operation of a boost converter is shown in FIG. 1. In this, an inductor L is connected between a battery, which provides a voltage $V_{BAT}$, and two switches $S_1$ and $S_2$ that connect the inductor either to ground or to an output capacitor C. $S_1$ is closed at the start of each cycle, which has a period T, and opens when the current flowing through it reaches a set-point value $I_{SET}$. The value of $I_{SET}$ is adjusted to control the duty cycle D of operation. $S_2$ is closed when $S_1$ is open and vice-versa.

The resulting current in the inductor L, $I_L$, has a triangular shape. The gradient of the slopes are determined by the battery voltage $V_{BAT}$ and the difference between battery and output voltage $V_{SAT}-V_{OUT}$ as can be seen from the waveforms in FIG. 1. The current flowing in the capacitor C, $I_C$, is also shown.

In the configuration shown in FIG. 1, the ratio between output voltage and battery voltage is determined by the duty cycle D. Thus:

$$V_{OUT} = \frac{V_{BAT}}{1-D} = \frac{V_{BAT}}{D'}$$

$$I_L = \frac{V_{OUT}}{RD'} = \frac{V_{BAT}}{RD'^2}$$

where $D'=1-D$.

Typical component values for L and C are 1 µH and 10 µF respectively.

The duty cycle D required to obtain a desired value of output voltage, $V_{REF}$, is dependent on $V_{BAT}$ and also on the load current $I_R$ (because of non-ideal components that give power losses). To regulate $V_{OUT}$ to $V_{REF}$ when variations in the battery voltage or load current occur, a controller is normally used to adjust the duty cycle D based on the values of the two state variables $I_L$ and $V_{OUT}$. An example is shown in FIG. 2, in which the controller measures the output voltage $V_{OUT}$ and compares it with a reference voltage $V_{REF}$ to generate an error voltage, which is used to adjust the peak current that is allowed to flow in the inductor L. When the peak current is reached, the controller opens $S_1$ and closes $S_2$. Peak current mode control is a well-known method for regulating the peak inductor current $I_L$ to the set point $I_{SET}$.

For frequencies much lower than the switching frequency of the boost converter, a continuous time approximation can be used, in which the average of each signal over a single clock period is considered. The inductor current under peak current mode control can be represented as a controlled current source as shown in FIG. 3. In an AC model derived with a continuous time approximation the controlled current source $i_{out}$ depends on the set point with a transfer function F:

$$i_{OUT} = F(s) i_{SET}$$

where $i_{OUT}$ and $i_{SET}$ are the small signal perturbations of $I_{OUT}$ and $I_{SET}$ respectively. Here, the transfer function F(s) contains a right-half-plane zero $\omega_Z$ with:

$$F(s) = D'\left(1 - \frac{s}{\omega_Z}\right)$$

and $$\omega_Z = \frac{V_{BAT}}{I_L L}$$

The zero is the result of the fact that any increase in output current requires an increase in the inductor current. However, a step increase in inductor current is obtained with a single period increase in D (decrease in D') that causes a single period with reduced output current. For the ease of illustration we will only consider frequencies far below the zero frequency where F(s) can be approximated with a constant.

$$F(s) = D'$$

$I_{SET}$ is a function G of the error in the output voltage as can be seen in FIG. 4. The negative feedback regulates the output voltage, $V_{OUT}$, so that it is equal to the reference voltage $V_{REF}$. G(s) represents the controller transfer function from output voltage variation $v_{OUT}$ to peak current set point variation $i_{SET}$. From the state equation for the output voltage on capacitor C we can derive the output impedance.

$$sCv_{OUT} = i_C = i_{OUT} - i_R = D'i_{SET} - i_R$$

$$sCv_{OUT} = -D'G(s)v_{OUT} - i_R$$

$$v_{OUT}(sC + D'G(s)) = -i_R$$

The output impedance of the converter $Z_{OUT}$ is now defined as the decrease in output voltage as a result of an increase in load current:

$$Z_{OUT}(s) = -\frac{v_{OUT}}{i_R} = \frac{1}{sC + D'G(s)}$$

Usually, a low output impedance is required for a boost converter. Stability must also be guaranteed for both loaded and unloaded conditions. The controller transfer function G(s) must be designed in such a way that these requirements are satisfied.

The output impedance and the current slew rate of the boost converter will determine the variation on the boost voltage $v_{OUT}$ caused by the load current variations $i_R$. For low frequencies, sufficient loop gain is usually available to keep the output impedance (and therefore the resulting output voltage variation) low. However, for high frequencies, the output capacitor becomes the dominant factor in the output impedance.

When the load of the boost converter is a Class-D amplifier, the load can be considered to be a current sink that follows twice the audio signal frequency as shown in FIG. 4. When the amplifier is clipping, also harmonics of the audio frequencies are present in the load current. The worst case variation in the boost voltage will occur after a step change in the load current from a maximum value to zero. The output current of the boost converter must be regulated to zero in response to this step change. Any delay in achieving the regulated value of zero causes an overshoot on the boost voltage.

However, the negative feedback controller on the boost converter needs to measure an error in the output voltage before it can react to load variations. Thus, the output current can only be regulated to a new value with a limited speed. Until the output current is equal to the load current, the difference in the two currents causes a corresponding charging or discharging of the output capacitor, leading to an unwanted voltage variation $v_{OUT}$ on the steady state value $V_{OUT}$. This is especially noticeable for a step change from maximum load current to zero load current or for a strongly clipping audio signal.

As mentioned above, any such variation must be taken into account in specifying the nominal output voltage from the boost converter because exceeding the maximum supply voltage of a Class-D amplifier or other circuitry usually triggers an overvoltage protection that will shut down the amplifier or other circuitry.

In the case of a Class-D amplifier, this limits the maximum output power of the amplifier significantly. As an example, the response of a boost converter to a maximum step in the audio signal and the response to a 10 kHz clipping sine wave can be seen in FIGS. 5 and 6 respectively. In each Figure, the uppermost trace (labeled $V_{OUT}$) shows the variation in the output voltage from the boost converter; the trace immediately below (labeled $I_L$) shows the variation in load current; the trace below that (labeled $V_{AUD}$) shows the audio output signal from the Class-D amplifier; and the lowest trace (labeled $I_{SET}$) shows the variation in the set-point value of the current flowing in the inductor of the boost converter. It can be seen in each case that the output voltage $V_{OUT}$ varies significantly from its nominal value of 5V because $I_{SET}$ and hence $I_L$ take a finite length of time to respond to changes in the value of $V_{AUD}$.

Thus, as is apparent from the above analysis, the transient response of a switched-mode power supply controlled by negative feedback is not adequate to allow tightly specified values of output voltage to be used because output voltage variations can lead to unacceptable overvoltage situations. This is wasteful in terms of achieving maximum circuit performance. For example, maximum output power of a Class-D power amplifier cannot be achieved without danger of triggering overvoltage circuit protection in the event of a large step change in current demand or a clipping audio signal.

According to the invention, there is provided a method of operating a switched-mode power supply (SMPS) for supplying power to a load circuit, which draws a supply current that varies with an input signal to the load circuit, the method comprising monitoring the input signal and controlling the amount of accumulated energy transferred for consumption by the load circuit, in use, in accordance with the input signal.

There is also provided a SMPS for supplying power to a load circuit, which draws a supply current that varies with an input signal to the load circuit, the SMPS comprising a controller adapted to monitor the input signal and control the amount of accumulated energy transferred for consumption by the load circuit, in use, in accordance with the input signal.

The invention exploits the fact that the supply current demand of the load circuit depends on the input signal. By monitoring the input signal and controlling the amount of accumulated energy transferred for consumption by the load circuit in accordance with the input signal, the invention allows the correct amount of accumulated energy to be transferred to meet the demand. It is no longer necessary for there to be a deviation in the output voltage from a desired value for the SMPS to respond to load variations and the problems discussed above are therefore overcome.

The SMPS may be a boost converter or a buck converter or other type of SMPS.

It is possible that either the whole of the accumulated energy is transferred or that only a portion of the accumulated energy is transferred.

In a preferred embodiment, the amount of accumulated energy transferred is controlled to meet a predicted supply current requirement based on the input signal in accordance with a predetermined mathematical model.

Thus, the controller may be adapted to control the amount of energy transferred to meet a predicted supply current requirement based on the input signal in accordance with a predetermined mathematical model.

The predicted supply current requirement is usually calculated from the input signal, and the controller is, in this case, adapted to calculate the predicted supply current requirement from the input signal.

The amount of accumulated energy transferred may be controlled by adjusting the switching duty cycle of the SMPS, thereby controlling the ratio of time spent in a first state, in which energy is accumulated, to that spent in a second state, in which accumulated energy is transferred for consumption by the load circuit.

To achieve this, the controller may be adapted to control the amount of accumulated energy transferred by adjusting the switching duty cycle of the SMPS, thereby controlling the ratio of time spent in a first state, in which energy is accumulated, to that spent in a second state, in which accumulated energy is transferred for consumption by the load circuit.

In the first state, the controller may be adapted to actuate a switch or switches to cause current to flow into an energy storage device, and in the second state the controller may be adapted to actuate the or each switch to cause current to flow from the energy storage device for consumption by the load circuit.

In one embodiment, the energy is accumulated by an inductor and the duty cycle is adjusted such that the peak current flowing in the inductor is equal to a set-point value. In this case, the controller may be adapted to adjust the duty cycle such that the peak current flowing in the inductor is equal to a set-point value.

The set-point value is typically adjusted in accordance with the predicted supply current requirement, and the controller is typically adapted to adjust the set-point value in accordance with the predicted supply current requirement.

The method may further comprise controlling the amount of accumulated energy transferred for consumption by the load circuit, in use, in accordance with deviation of an output voltage of the SMPS from a reference value. Thus, the controller may be further adapted to control the amount of accumulated energy transferred for consumption by the load circuit, in use, in accordance with deviation of an output voltage of the SMPS from a reference value.

In a preferred embodiment, the load circuit is a power amplifier, such as a Class-D power amplifier.

The invention may of course be used with other types of load circuit, which draw a supply current that varies with an input signal to the load circuit. For example, the load circuit may be a Class-AB power amplifier. Alternatively, it could be used with switched load circuits, for example a microprocessor or an LED driver switched on and off by an enable input signal. In this case, if the enable signal is driven low then the energy transferred for consumption by the load can be reduced directly to zero without waiting for an error to be present on the output voltage of the SMPS. Similarly, if the enable signal is driven high, the energy transferred for consumption by the load can be controlled to be the value required by the enabled microprocessor or LED driver. If a time-dependent load (e.g. a capacitive or an inductive load) is present then a mathematical model of this may be used to determine the amount of energy that should be transferred for consumption by the load.

When the load circuit is a power amplifier, the predicted supply current requirement may be calculated from the input signal using the formula:

$$I_{LOAD} = \frac{(AV_{IN})^2}{\eta_d V_{OUT} Z_{SP}}$$

in which:
$I_{LOAD}$ is the predicted supply current requirement;
A is the power amplifier gain;
$V_{IN}$ is the input signal;
$\eta_d$ is the efficiency of the amplifier;
$V_{OUT}$ is the SMPS output voltage; and
$Z_{SP}$ is the impedance of a speaker.

Thus, the controller may be adapted to calculate the predicted supply current requirement from the input signal using this formula. In this case, the predicted supply current requirement is a prediction of the supply current required by the amplifier.

If the SMPS is a boost converter using an inductor as an energy storage device within which energy is accumulated then the set-point value for the peak inductor current may be calculated using the formula:

$$I_{L(pk)} = \frac{(AV_{IN})^2}{\eta V_{BAT} Z_{SP}} + I_{RIPPLE(ampl)}$$

in which:
$I_{L(pk)}$ is the peak inductor current;
A is the power amplifier gain;
$V_{IN}$ is the input signal;
$\eta$ is the combined efficiency of the amplifier and SMPS;
$I_{RIPPLE(ampl)}$ is a ripple current amplitude;
$V_{BAT}$ is the SMPS input voltage; and
$Z_{SP}$ is the impedance of a speaker.

The controller may be adapted to calculate the set-point value for the peak inductor current from the input signal using this formula. In this case, the controller will usually be adapted to adjust the duty cycle such that the peak current flowing in the inductor is equal to the set-point value.

The power amplifier gain parameter in the above equations is typically set to zero if a mute input is asserted and/or an enable input is negated. The controller may be adapted to monitor a mute input and/or an enable input and to set the power amplifier gain parameter to zero if the mute input is asserted and/or the enable input is negated.

The predicted supply current requirement may be limited to a maximum value corresponding to a maximum supply current requirement of the power amplifier. Thus, the controller may be adapted to limit the predicted supply current requirement to a maximum value corresponding to a maximum supply current requirement of the power amplifier.

The method may further comprise delaying the input signal to the load circuit subsequent to monitoring it by an amount equal to a processing delay. Thus, the SMPS may comprise a delay module for delaying the input signal to the load circuit to provide a delay equal to a processing delay between monitoring the signal and receiving it at the load circuit. This ensures that the operation of the SMPS is synchronised with the operation of the load circuit. The processing delay will be the delay incurred by the operation of the controller.

BRIEF DESCRIPTION OF THE DRAWINGS

Examples of the invention will now be described in detail with reference to the accompanying drawings, in which.

DETAILED DESCRIPTION OF THE EMBODIMENTS

The invention provides a way for operating a SMPS, such as a boost converter, in which feed-forward control is used to predict the variable load current that will be drawn by a load circuit. The input signal to the load circuit is used to predict the current that will be required by the load circuit. By adjusting the operation of the SMPS so that it varies the amount of energy made available to the load circuit depending on the input signal, the control system is able to react much more rapidly. With prior feedback-based systems, an error in the output voltage had to be detected before the control system could respond to vary the amount of energy available to the load circuit.

Figure 1:
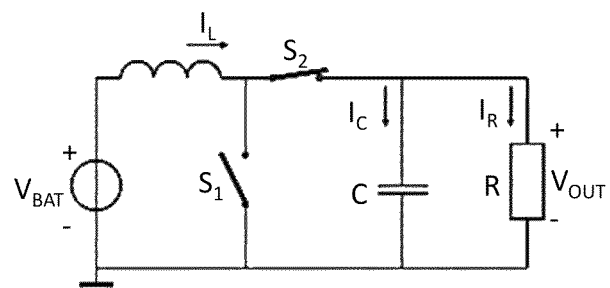
FIG. 1 shows a schematic and associated waveforms for illustrating the principle of operation of a boost converter.
Figure 1:
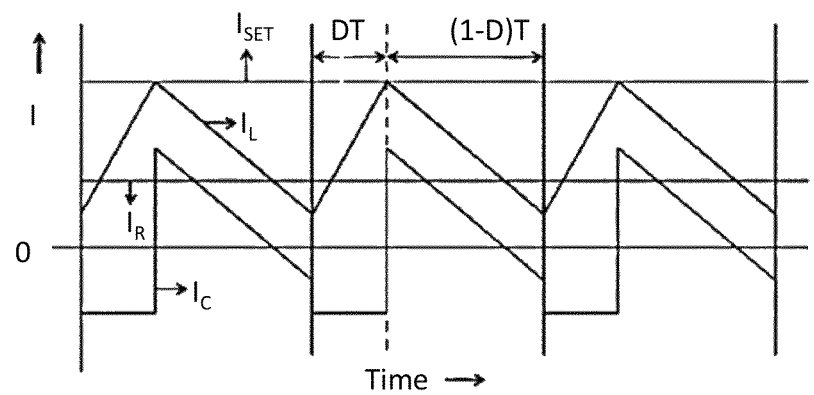
Figure 2:
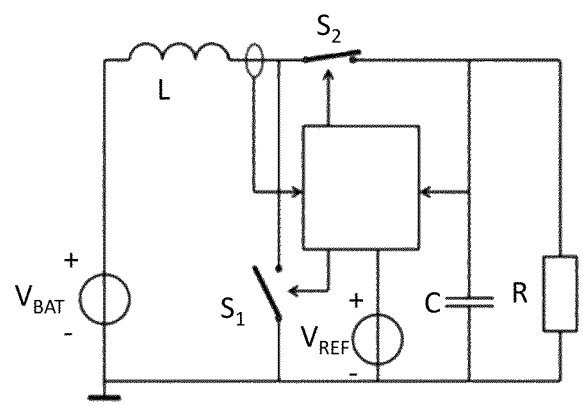
FIG. 2 shows a prior art boost converter with feedback control.
Figure 3:
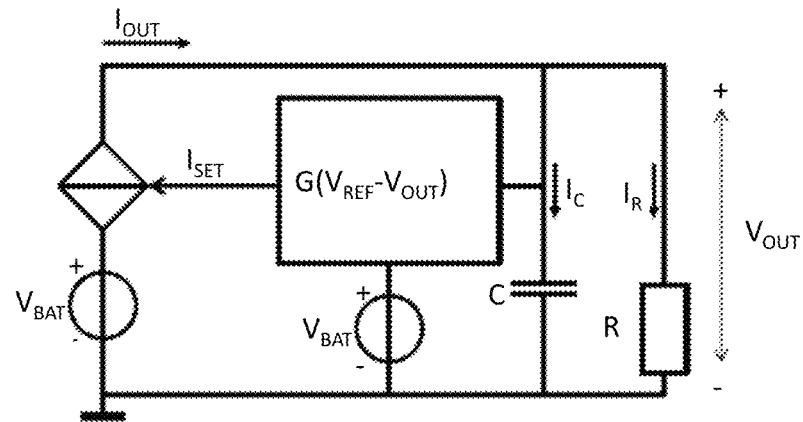
FIG. 3 shows a schematic representation of a boost converter with current mode control.
Figure 4:
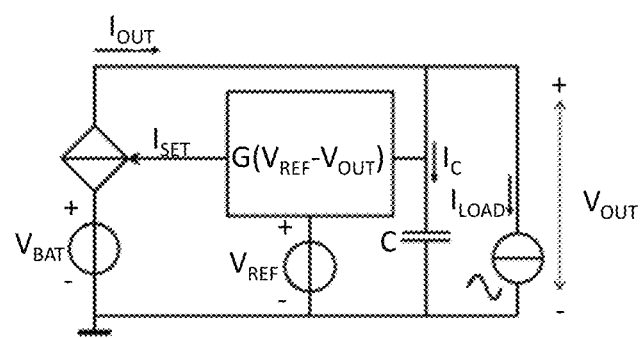
FIG. 4 shows a schematic representation of a boost converter with current mode control and a current sink load.
Figure 5:
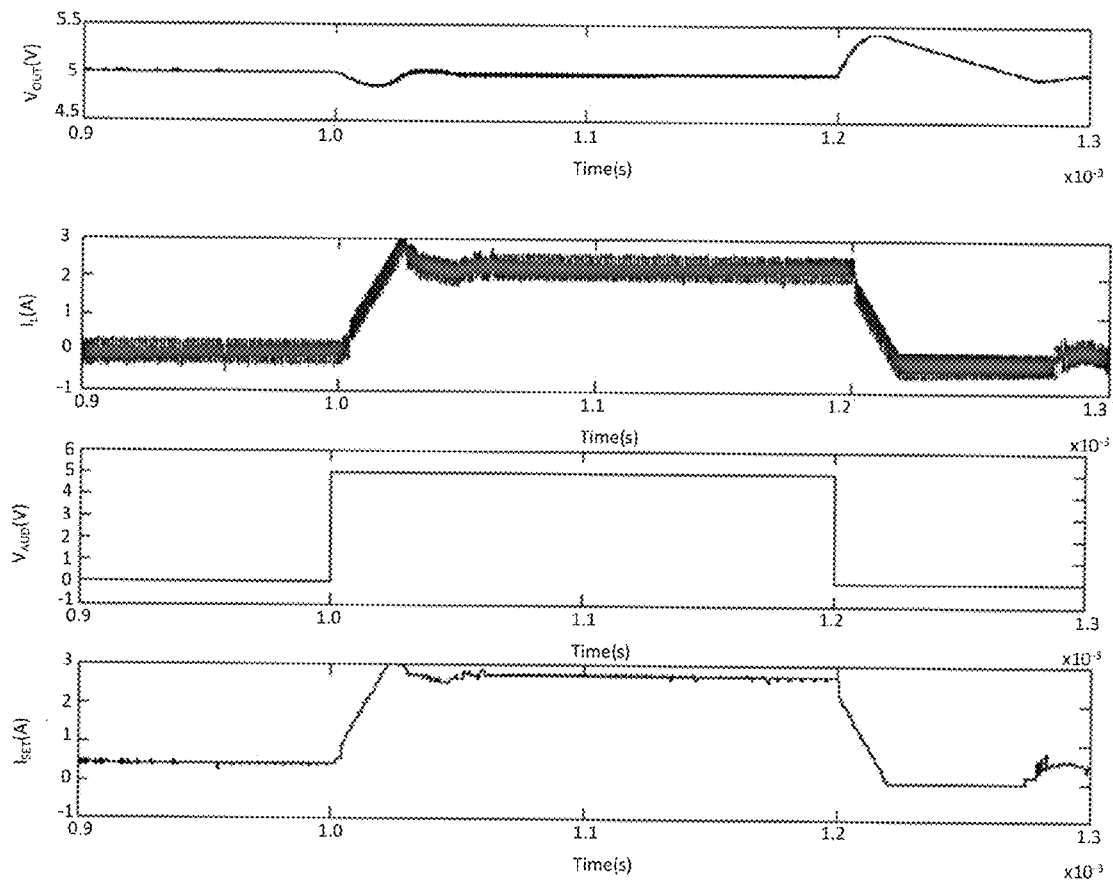
FIGS. 5 and 6 show waveforms at various points in the circuit of FIG. 4 under step change load conditions and when an audio output signal is clipping respectively.
Figure 6:
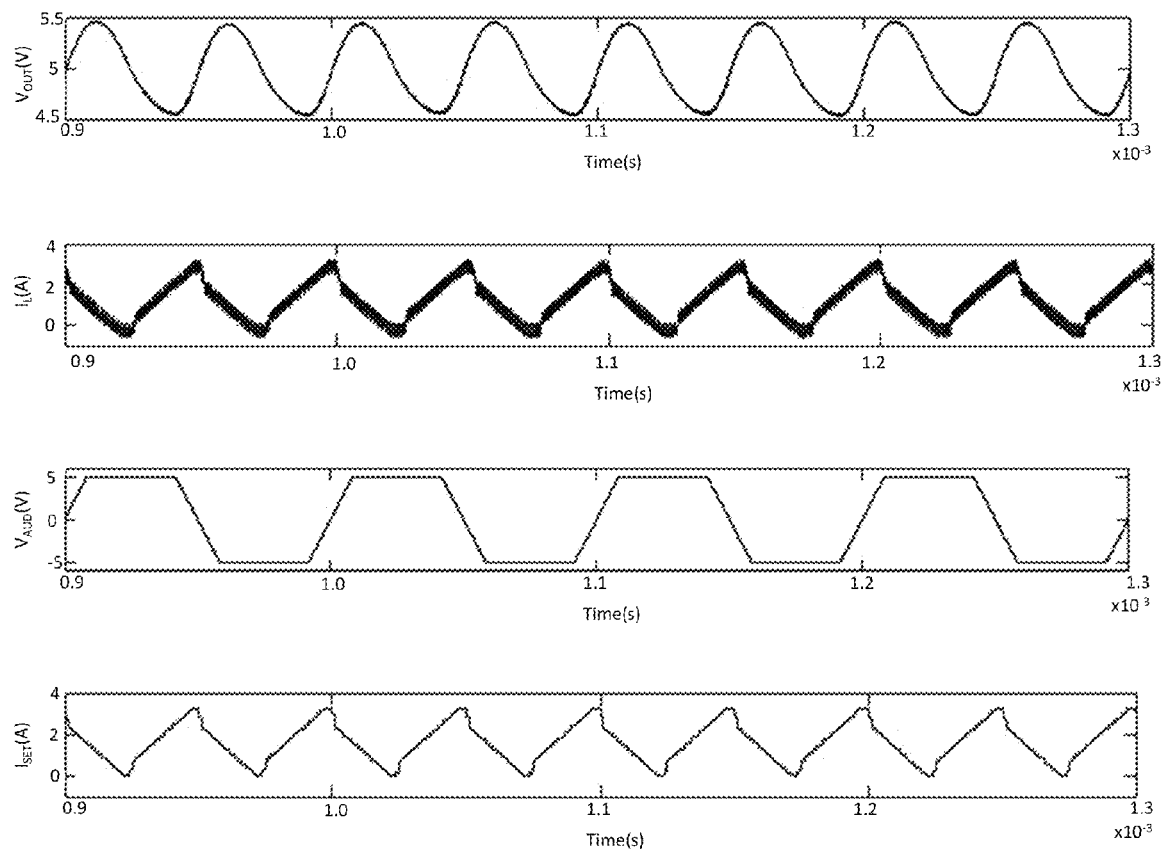
Figure 7A:
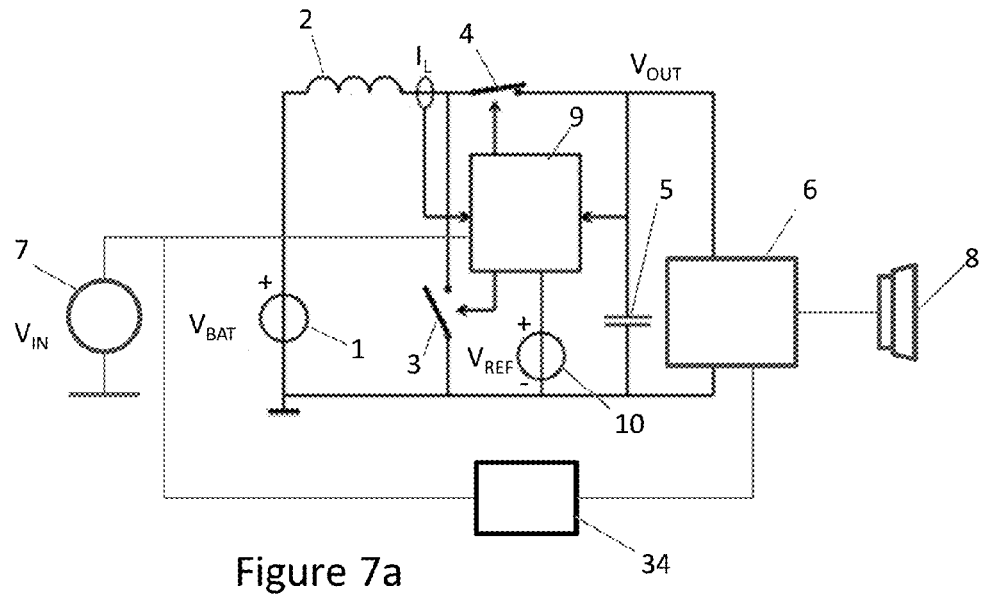
FIGS. 7a and 7b shows a schematic representation of a boost converter according to the invention.
Figure 7B:
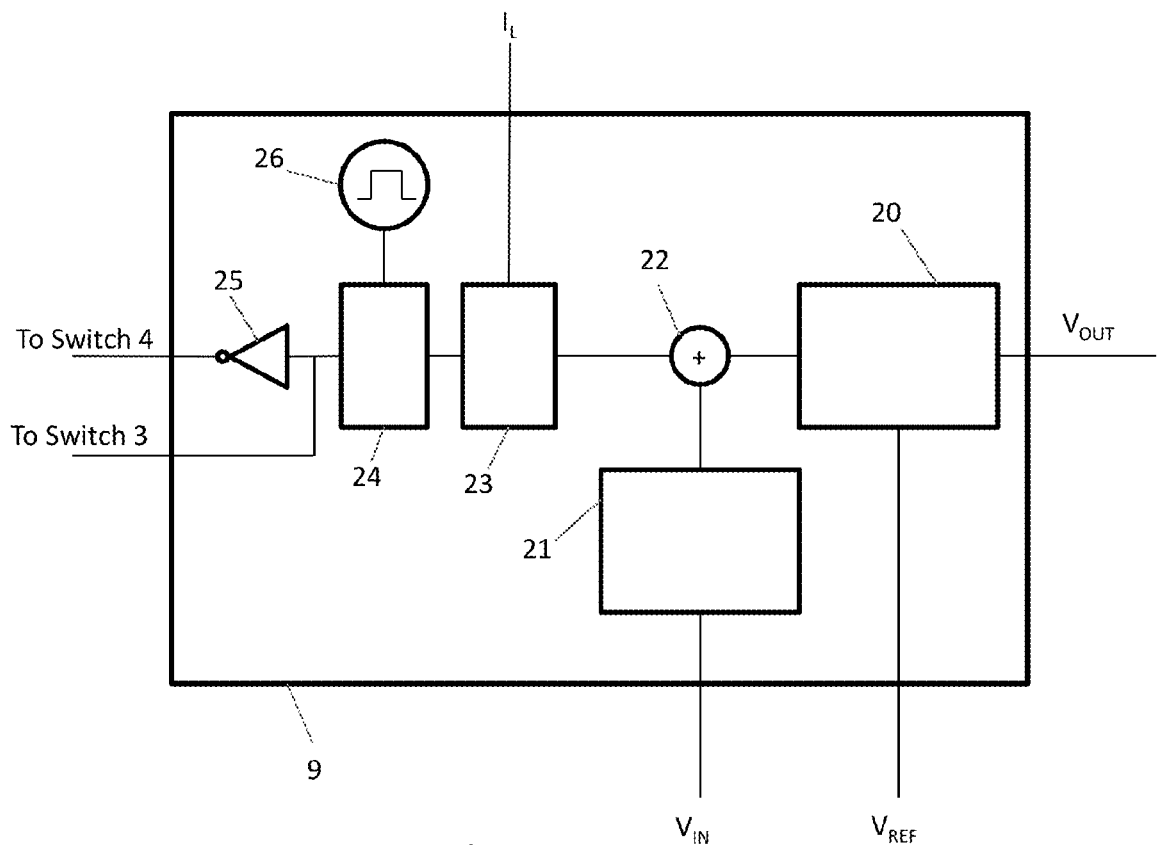

FIG. 7a shows a boost converter according to one embodiment of the invention. In this, a battery 1 provides DC power and is coupled to one terminal of an inductor 2. The other terminal of the inductor 2 is coupled to the junction of two switches 3 and 4. These are typically MOSFET switches, although other semiconductor switches, such as SCRs or TRIACs, could be used. An output voltage is established across capacitor 5 for powering a Class-D audio amplifier 6. The amplifier 6 amplifies an audio signal VIN from audio signal source 7 for reproduction on loudspeaker 8. A controller 9 measures the output voltage from the converter and current flowing through the inductor 2. It also receives inputs from a reference voltage 10 and the audio signal VIN from audio signal source 7. Based on these four inputs, the controller 9 controls the switching of switches 3 and 4 to control the amount of energy provided to the amplifier 6. The operation of the controller 9 is described in detail below with reference to FIG. 7b.

The controller 9 comprises a feedback control element 20, which compares the output voltage $V_{OUT}$ with a reference voltage $V_{REF}$. The feedback control element 20 provides an output that is a function G of $V_{REF}$–$V_{OUT}$. The output from control element 20 thus provides a signal indicating the peak current that is required to flow in inductor 2 to maintain $V_{OUT}$ at the value of $V_{REF}$. A feed-forward current prediction element 21 calculates a value of the peak current that is required to flow in inductor 2 to meet a predicted value of current demand by amplifier 6. It calculates this from input signal $V_{IN}$ using a mathematical model of the amplifier 6 and speaker 8 that will be described in detail below. The output signals from feedback control element 20 and feed-forward current prediction element 21 are added together in summing element 22 to provide a current set-point value for the peak current flowing in inductor 2.

The signal from summing element 22 is compared with a signal representing the current flowing through inductor 2 in comparator 23. The current flowing through inductor 2 may be monitored using a variety of different sensing techniques. For example, the voltage across a low ohmic value resistor in series with inductor 2 may be measured to indicate the current or inductive techniques may be used.

When the comparator 23 detects that the current flowing through inductor 2 equals the set-point value output by summing element 22 then it outputs a signal to cause latch 24 to open switch 3. Switch 4 is closed by virtue of the inverter 25. An oscillator 26, which produces a square wave output at the frequency of operation of the converter, causes the latch 24 to reset at the end of each switching period so that switch 3 is closed again and switch 4 is opened again.

In this way, the converter switches between two states: a first state in which switch 3 is closed and switch 4 is open and current flows through inductor 2, and a second state in which switch 3 is open and switch 4 is closed so that the collapsing magnetic field around inductor 2 can cause a current to flow from inductor 2 to the amplifier 6 and capacitor 5. The transition from the first to the second state occurs when the current flowing through inductor 2 (and hence the energy stored in its magnetic field) has reached the set-point value. The transition back to the first state (i.e. the start of the next switching cycle) occurs when the oscillator resets the latch 24.

This arrangement simply injects the predicted current requirement into the control loop. The boost converter is in effect provided with a digital proportional integral (PI) controller that modifies the set-point value for the peak current mode control. DC and low frequency errors in the predicted current requirement are automatically compensated by the negative feedback loop. Therefore, the accuracy of the prediction is only important in the frequency range where the gain of the negative feedback loop is no longer sufficient.

For a Class-D amplifier, a prediction of its supply current demand can be made based on the audio input signal, the amplifier gain, a speaker model and the boost convert output voltage. The voltage signal across the speaker can be calculated from the gain of the amplifier and the input signal. With knowledge of the output voltage of the boost converter, it is also possible to determine when clipping will occur.

For a signal $V_{SP}$ across a speaker with impedance $Z_{SP}$, the power delivered to the speaker, $P_{SP}$, is:

$$P_{SP} = V_{SP} I_{SP} = V_{SP} \frac{V_{SP}}{Z_{SP}}$$

If the efficiency of the Class-D amplifier is $\eta_d$ then the load current for the boost converter (i.e. the current demanded by the amplifier) is equal to:

$$I_{LOAD} = \frac{P_{SP}}{\eta_d V_{OUT}}$$

where $V_{OUT}$ is the output voltage from the boost converter.

This value of $I_{LOAD}$ is the current that the boost converter needs to provide to the amplifier. The value of peak inductor current, $I_{L(pk)}$, (i.e, the set-point value) required to achieve this value of $I_{LOAD}$ can be calculated from this if the efficiency of the boost converter, $\eta_b$, and the DC input voltage, $V_{BAT}$, to the boost converter are known. The actual inductor current $I_L$ is equal to the sum of the continuous time approximation of the inductor current and the ripple current $I_{RIPPLE}$ added by the switching operation. The peak value of the inductor current is therefore shifted relative to the average inductor current with the amplitude of the ripple current $I_{RIPPLE(ampl)}$. Thus:

$$I_{L(pk)} = \frac{P_{SP}}{\eta_d \eta_b V_{BAT}} + I_{RIPPLE(ampl)} = \frac{P_{SP}}{\eta V_{BAT}} + I_{RIPPLE(ampl)}$$

where $\eta$ is the product of $\eta_d$ with $\eta_b$.

The amplitude of the ripple current $I_{RIPPLE(ampl)}$ can be considered constant and only adds a DC shift. The negative feedback controller that is also in the system will automatically compensate this term and therefore it can be neglected in the calculation.

The voltage across the speaker, $V_{SP}$, obviously depends on the audio source signal and the voltage gain of the Class-D amplifier, i.e. $V_{SP}$ is the product of amplifier voltage gain, A, with the audio input signal $V_{IN}$. Therefore, substituting this and the equation for $P_{SP}$ into the equation for $I_{L(pk)}$ above yields:

$$I_{L(pk)} = \frac{(AV_{IN})^2}{\eta V_{BAT} Z_{SP}}$$

Figure 8:
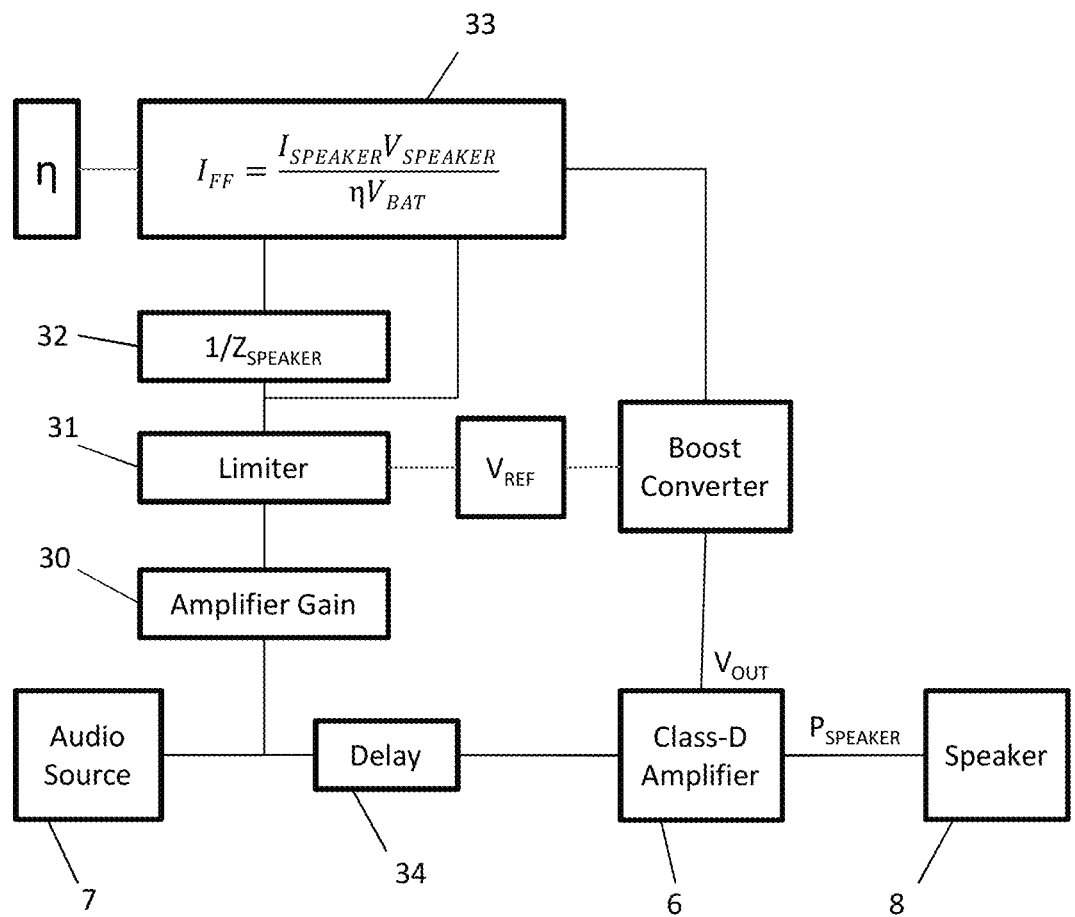
FIG. 8 shows a block diagram of circuitry for implementing a mathematical model to predict the current required to flow in an inductor in the boost converter of FIGS. 7a and 7b.

Thus, it is possible to predict a value for the peak current required to flow in inductor 2 from the audio input voltage $V_{IN}$ provided that the voltage gain of amplifier 6, combined efficiency $\eta$ of the amplifier 6 and boost converter, input voltage of the converter $V_{BAT}$ and speaker impedance $Z_{SP}$ are known. The feed-forward current prediction element 21 includes circuitry, a block diagram of which is shown in FIG. 8.

In this, a block 30 multiplies the input signal $V_{IN}$ from audio source 7 by the amplifier gain A. The block 30 also receives mute and enable inputs that are provided to amplifier 6. If the mute input is asserted or the enable input negated then the output from block 30 will be zero. Block 30 provides an output that represents the size of the output signal from amplifier 6.

A limiter 31 limits the output from block 30 to $V_{REF}$ so that it cannot exceed the desired output voltage of the converter. This limiter 31 therefore models the clipping behaviour that will be exhibited by the amplifier if the audio signal is too large for the headroom of amplifier 6.

Another calculation block 32 models the speaker impedance and divides the output from limiter 31 by the value of the speaker impedance. The speaker model used for the current prediction only needs to be accurate for higher frequencies. Any low frequency resonance peaks (caused for example by mechanical resonance) in the speaker impedance are not required in the model as these can generally be handled by the negative feedback loop. Thus, the speaker impedance model required for the current prediction only takes account of the voice coil resistance, $R_E$, and inductance, $L_E$. Thus, calculation block 32 calculates the current through the speaker using a first order RL filter model based on the values of the parameters $R_E$ and $L_E$. These values may be loaded into the controller device for example using an I²C interface.

Calculation block 33 receives inputs from limiter 31 (representing the voltage across the speaker) and block 32 (representing the current through the speaker). These inputs are multiplied together in block 33 and divided by values for the combined efficiency of the boost converter and amplifier 6 and the input voltage to boost converter $V_{BAT}$. The output from calculation block 33 provides a signal that can be used as the output of feed-forward current prediction element 21 shown in FIG. 7b.

The time required for the calculations performed by blocks 30 to 33 is compensated by a delay block 34 between audio signal source 7 and amplifier 6.

As mentioned previously, the invention can be used with other types of load circuit, which draw a supply current that varies with an input signal to the load circuit. The mathematical model used with these will of course need to be tailored to the specific load circuit. As another example, a switched resistive load could make use of the following mathematical model describing the load current requirements:

$$I_{LOAD} = \text{enable} \cdot \frac{V_{OUT}}{R}$$

where:
enable is equal to 1 when true and 0 when false; and
R is the resistance of the resistive load.

The current prediction for the peak current required in inductor 2 to transfer the correct amount of energy is then:

$$I_{L(pk)} = I_{LOAD} \frac{V_{OUT}}{V_{BAT}} = \text{enable} \cdot \frac{(V_{OUT})^2}{R V_{BAT}}$$

When a prediction can be made of the load current for the boost converter, feed forward can be used in parallel to the existing negative feedback system. The current prediction can be injected in the current mode control loop. As long as the prediction is accurate, no output voltage error is required to obtain the correct output current. The response speed is no longer limited by the control function but only by the rising or falling slope of the inductor current. Therefore, the negative feedback loop from output voltage to current set point only needs to correct the error in the current prediction. This relaxes the requirements on the control function considerably, especially for higher frequencies. In the case of a boosted class-d audio amplifier, the required inductor current of the boost converter can be predicted using the audio signal, a speaker model and the target boost voltage.

Figure 9:
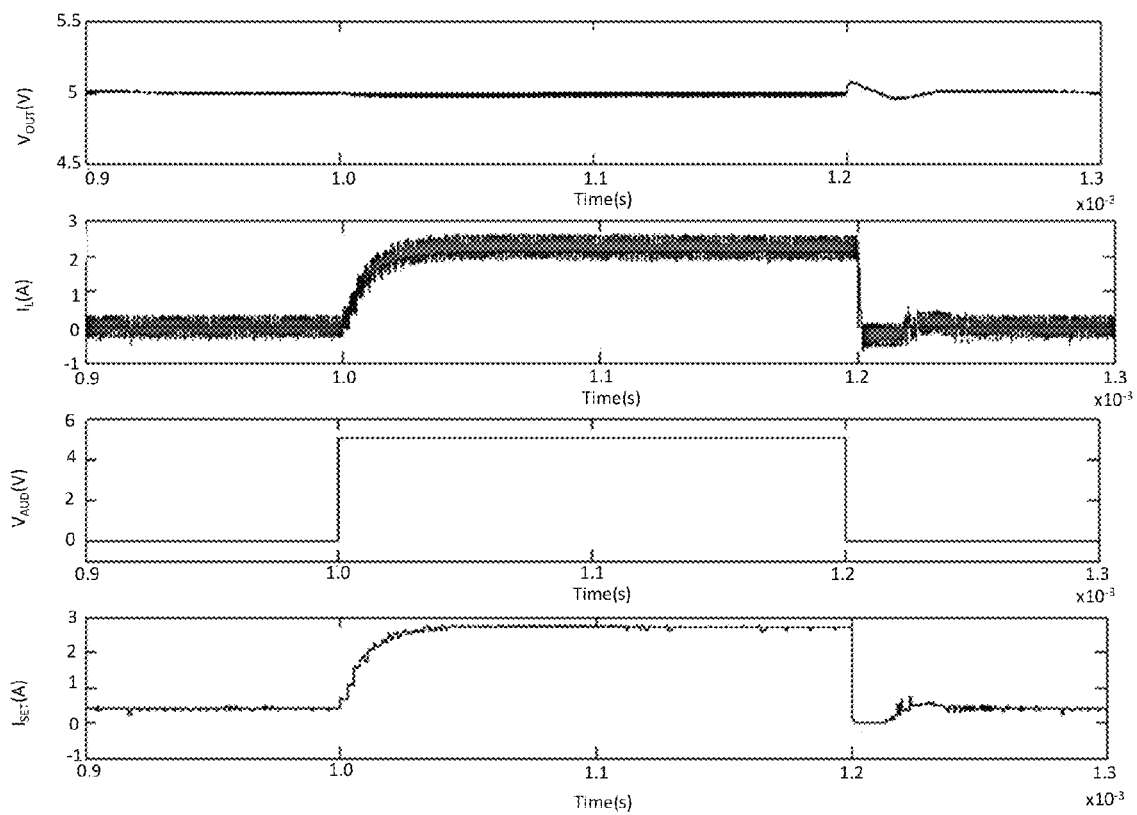
FIGS. 9 and 10 show waveforms at various points in the circuit of FIGS. 7a and 7b under step change load conditions and when an audio output signal is clipping respectively.
Figure 10:
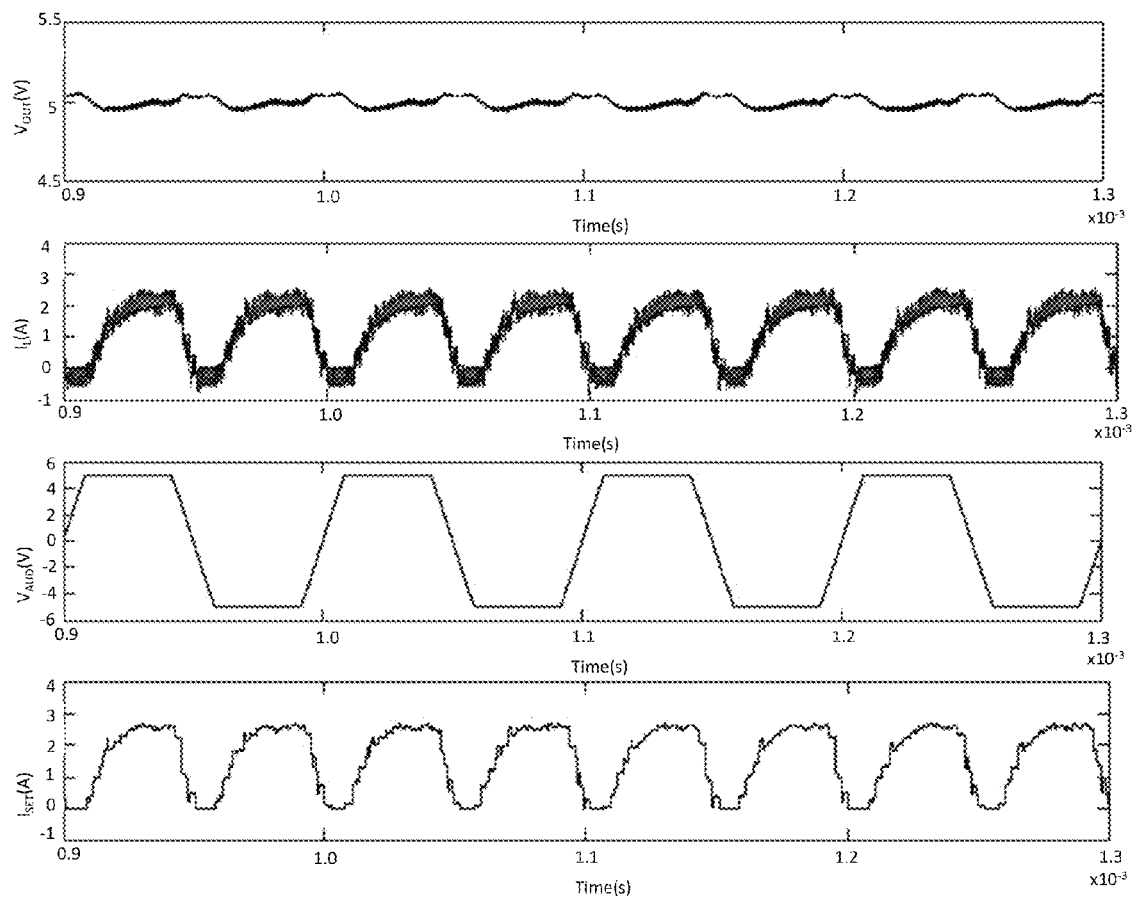

The response of the boost converter described above with reference to FIGS. 7a, 7b and 8 using the feed-forward current mode control is illustrated in FIGS. 9 and 10. FIG. 9 shows the response to a step change in the audio signal, whereas FIG. 10 shows the response to a 10 kHz clipping sine wave. In each Figure, the uppermost trace (labeled $V_{OUT}$) shows the variation in the output voltage from the boost converter; the trace immediately below (labeled $I_L$) shows the variation in load current; the trace below that (labeled $V_{AUD}$) shows the audio output signal from the Class-D amplifier; and the lowest trace (labeled $I_{SET}$) shows the variation in the set-point value of the current flowing in the inductor of the boost converter. It can be seen in each case that the output voltage remains within in a +/−40 mV window of the nominal value of 5V.

The slew rate of the boost converter output current is limited by the maximum duty cycle and the slopes that are determined by the inductor value and the battery DC voltage and output voltage. This slew rate has now become the limiting factor, determining the voltage overshoot produced in response to the falling edge of the audio signal. For a 10 kHz clipping sine wave, the original controller was not able to follow the signal. However, with the feed-forward current mode control, the output voltage stays within the above-mentioned window.

Figure 11:
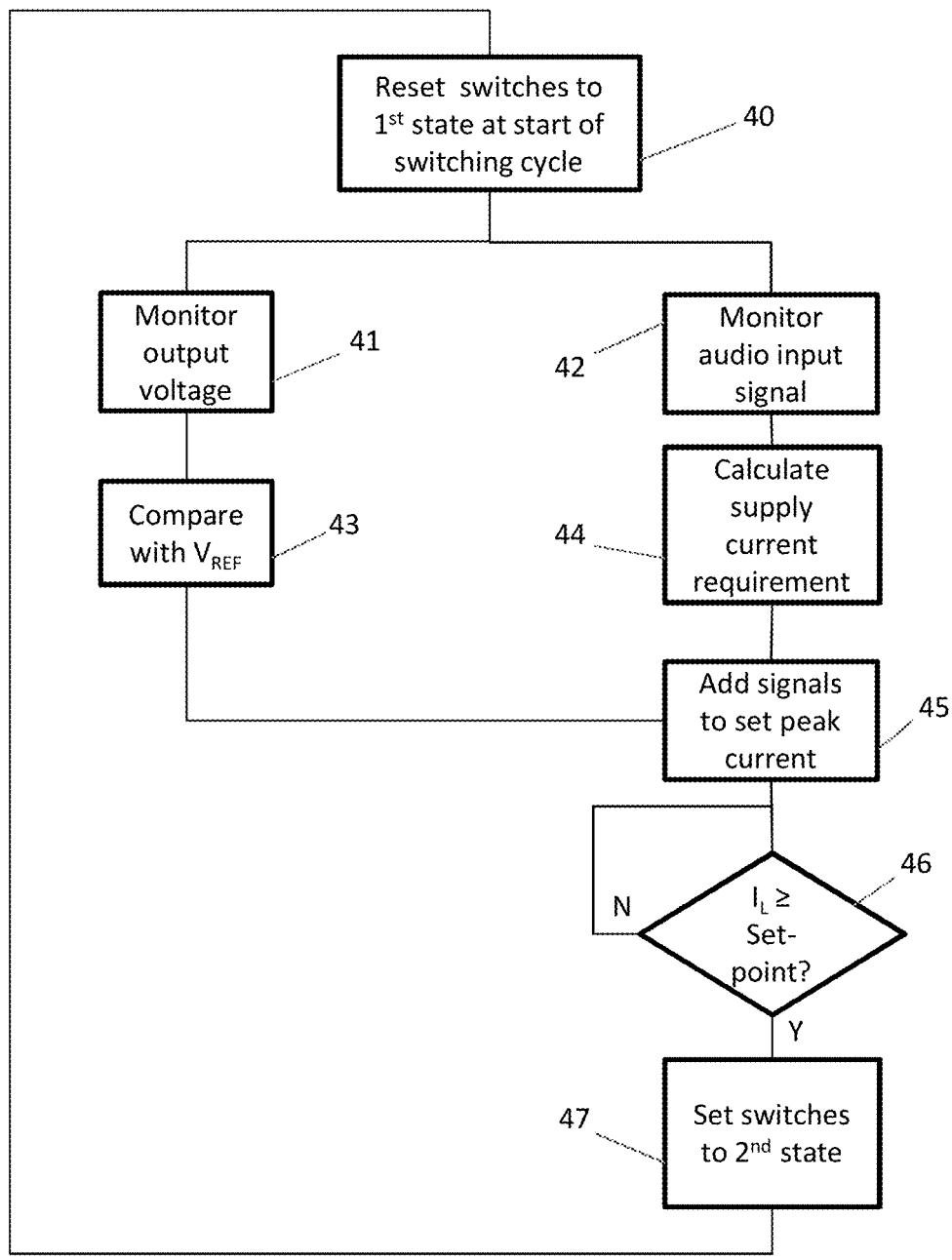
FIG. 11 shows a flowchart of the method performed by the boost converter of FIGS. 7a, 7b and 8.

FIG. 11 shows a flowchart of the method performed by the boost converter. At the start in step 40, the switches 3 and 4 are reset so that the converter is in the first state, i.e. with switch 3 closed and switch 4 open so that current flows from the battery 1 through inductor 2. This causes energy to accumulate in the magnetic field of inductor 2.

Then there are two parallel branches. In step 41, the output voltage $V_{OUT}$ across capacitor 5 is monitored by the controller 9. The monitored output voltage is compared with a reference voltage in step 43 to provide an error signal, which is used to adjust the peak current that flows in inductor 2.

In step 42, the audio input signal is monitored, and the peak current required to flow in inductor 2 to meet a predicted supply current requirement of the load circuit (i.e. amplifier 6 in this case) is then calculated in step 44. The calculation in step 44 proceeds according to the mathematical model described above with reference to FIG. 8. The output from step 44 is therefore a signal that can be used to adjust the set-point for the peak current that flows in inductor 2.

In step 45, the signals from steps 43 and 44 are added together, and the result of this addition is compared, in step 46, with the current flowing through inductor 2. If the current flowing through inductor 2 is equal to or greater than the set-point value determined in step 45 then, in step 47, the converter switches from the first state to the second state, i.e. the accumulated energy in the magnetic field of inductor 2 is transferred for consumption by the load circuit, amplifier 6. The method then returns to the start at step 40 when the converter switches back to the first state at the start of the next switching cycle.

Other variations to the disclosed embodiments can be understood and effected by those skilled in the art in practising the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A method of operating a switched-mode power supply (SMPS) for supplying power to a load circuit, which draws a supply current that varies with an input signal to the load circuit, the method comprising:
    monitoring the input signal; and
    controlling an amount of accumulated energy transferred for consumption by the load circuit, in use, in accordance with the input signal,
    wherein the amount of accumulated energy transferred is controlled to meet a predicted supply current requirement based on the input signal in accordance with a predetermined mathematical model.

2. A method according to claim 1, wherein the amount of accumulated energy transferred is controlled to meet a predicted supply current requirement based on the input signal in accordance with a predetermined mathematical model.

3. A method according to claim 1, wherein the amount of accumulated energy transferred is controlled by adjusting a switching duty cycle of the SMPS, thereby controlling a ratio of time spent in a first state, in which energy is accumulated, to that spent in a second state, in which accumulated energy is transferred for consumption by the load circuit.

4. A method according to claim 3, wherein the energy is accumulated by an inductor and the duty cycle is adjusted such that a peak current flowing in the inductor is equal to a set-point value.

5. A method according to claim 4, wherein the set-point value is adjusted in accordance with a predicted supply current requirement.

6. A method according to claim 1, the method further comprising controlling the amount of accumulated energy transferred for consumption by the load circuit, in use, in accordance with deviation of an output voltage of the SMPS from a reference value.

7. A method according to claim 1, wherein the load circuit is a power amplifier.

8. A method according to claim 7,
    wherein the predicted supply current requirement is calculated from the input signal using the formula:

$$I_{LOAD} = \frac{(AV_{IN})^2}{\eta_d V_{OUT} Z_{SP}}$$

in which:
    $I_{LOAD}$ is the predicted supply current requirement;
    A is a power amplifier gain parameter;
    $V_{IN}$ is the input signal;
    $\eta_d$ is an efficiency of the amplifier;
    $V_{OUT}$ is an SMPS output voltage; and
    $Z_{SP}$ is an impedance of a speaker.

9. A method according to claim 1, wherein the predetermined mathematical model includes a formula that includes a variable related to amplifier gain, the variable is set to zero if at least one of a mute input is asserted and an enable input is negated.

10. A method according to claim 8, wherein the predicted supply current requirement is limited to a maximum value corresponding to a maximum supply current requirement of the power amplifier.

11. A method according to claim 1, further comprising delaying the input signal to the load circuit subsequent to monitoring it by an amount equal to a processing delay.

12. A switched mode power supply (SMPS) for supplying power to a load circuit, which draws a supply current that varies with an input signal to the load circuit, the SMPS comprising a controller adapted to monitor the input signal and control an amount of accumulated energy transferred for consumption by the load circuit, in use, in accordance with the input signal, wherein the amount of accumulated energy transferred is controlled to meet a predicted supply current requirement based on the input signal in accordance with a predetermined mathematical model.

13. A SMPS according to claim 12, wherein the controller is adapted to control the amount of energy transferred to meet a predicted supply current requirement based on the input signal in accordance with a predetermined mathematical model.

14. A SMPS according to claim 12, wherein the load circuit is a power amplifier.

15. A SMPS according to claim 14,
    wherein the controller is adapted to calculate the predicted supply current requirement from the input signal using the formula:

$$I_{LOAD} = \frac{(AV_{IN})^2}{\eta_d V_{OUT} Z_{SP}}$$

in which:
- $I_{LOAD}$ is the predicted supply current requirement;
- $A$ is a power amplifier gain;
- $V_{IN}$ is the input signal;
- $\eta_d$ is an efficiency of the amplifier;
- $V_{OUT}$ is an SMPS output voltage; and
- $Z_{SP}$ is an impedance of a speaker.

16. The SMPS of claim 12, wherein the predetermined mathematical model includes a formula that includes a variable related to amplifier gain, the variable is set to zero if at least one of a mute input is asserted and an enable input is negated.

\* \* \* \* \*